(12) United States Patent
Chang et al.

(10) Patent No.: US 6,300,223 B1
(45) Date of Patent: *Oct. 9, 2001

(54) METHOD OF FORMING DIE SEAL STRUCTURES HAVING SUBSTRATE TRENCHES

(75) Inventors: Gene Jiing-Chiang Chang, Hsinchu Hsien; Chun-Cho Chen, Taipei, both of (TW)

(73) Assignee: Winbond Electronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/828,422

(22) Filed: Mar. 28, 1997

(30) Foreign Application Priority Data

Dec. 12, 1996 (TW) .................................................. 85115377

(51) Int. Cl.⁷ .................................................. H01L 21/78
(52) U.S. Cl. ......................... 438/460; 438/462; 438/700; 438/113; 438/114
(58) Field of Search .................................... 438/460, 462, 438/465, 700, 701, 702, 113, 114, 116, 963; 257/619, 620, 622, 623

(56) References Cited

U.S. PATENT DOCUMENTS

| | | | |
|---|---|---|---|
| 5,024,970 | * | 6/1991 | Mori ..................................... 438/462 |
| 5,414,297 | * | 5/1995 | Morita et al. ......................... 438/462 |
| 5,530,280 | * | 6/1996 | White ................................... 257/508 |
| 5,559,362 | * | 9/1996 | Narita .................................. 438/462 |
| 5,665,655 | * | 9/1997 | White ................................... 438/462 |
| 5,698,892 | * | 12/1997 | Koizumi et al. ...................... 257/620 |
| 5,772,906 | * | 6/1998 | Abraham ................................ 216/72 |
| 5,831,330 | * | 11/1998 | Chang .................................. 438/462 |
| 5,891,808 | * | 4/1999 | Chang et al. ......................... 438/462 |

* cited by examiner

Primary Examiner—Charles Bowers
Assistant Examiner—Jack Chen
(74) Attorney, Agent, or Firm—Ladas & Parry

(57) ABSTRACT

A die seal structure having trenches is provided. The die seal structure is formed on a silicon substrate and used to prevent lateral stress from causing damage to internal circuits in a die when a wafer is being cutted. A die seal comprises a buffer area, a seal ring and a buffer space. The buffer area is adjacent to the internal circuit. The buffer space is adjacent to a scribe line. The seal ring having a structure of stacked metal layers and dielectric layers is located between the buffer area and the buffer space. A trench for enhancing the stress-protection ability of the die seal is formed in the buffer space. The trench is formed by wet-etching $SiO_2$ residues on the buffer space using buffered HF, or wet-etching $Si_3N_4$ residues on the buffer space using phosphoric acid at 180° C. In addition, a portion of the substrate may be removed by wet etching using $HNO_3$ and HF. Dry etching may also be used to remove the dielectric residues and a portion of the silicon substrate on the buffer space.

19 Claims, 4 Drawing Sheets

METHOD OF FORMING DIE SEAL STRUCTURES HAVING SUBSTRATE TRENCHES

BACKGROUND OF THE INVENTION

1. Field of the Invention

The present invention relates in general to a semiconductor structure and its fabrication method, and, more particularly, to a die seal structure around a chip die for preventing the internal circuit of the chip die from the lateral stress induced during the period of cutting wafers, and its fabrication method.

2. Description of the Related Art

In the semiconductor process, a plurality of dies, each of which contains an integrated circuit, are fabricated on a semiconductor wafer at a time. Scribe lines are provided between every two adjacent dies so that the dies can be separated by cutting the semiconductor wafer along these scribe lines.

However, when a wafer is cut into a plurality of dies, lateral stress is induced, thereby affecting the internal circuits via the structure of the IC. Consequently, microcracking may occur and further affect the production yield. One approach for solving such a problem is to form a die seal structure between the scribe line and the peripheral region of the internal circuit. Therefore, stress induced by cutting wafers is generally blocked by the die seal and will not directly impact the internal circuit of a die. FIG. 1 shows a top view of a chip die. The die seal is directed to the structure between internal circuit 10 and scribe line 50. The die seal structure comprises buffer area 20, seal ring 30 and buffer space 40. Seal ring 30, which is a stacked structure comprising metal layers and dielectric layers, is usually formed together with the multi-metal interconnection process.

FIG. 2 (PRIOR ART) and FIG. 3 (PRIOR ART) illustrate two cross-sectional views of the conventional die seal structures, respectively. It is noticed that the die seal structures shown in FIG. 2 and FIG. 3 are formed together with a triple-metal interconnection process. Now referring to FIG. 2, the whole structure is formed on silicon substrate 4. Field oxide 12 is used as an isolation structure and also can be used to separate a die seal structure (comprising buffer area 20, seal ring 30 and buffer space 40) and internal circuit 10. Seal ring 30 comprises three dielectric layers 14, 16 and 18, wherein dielectric layer 16 is formed over dielectric layer 14, and dielectric layer 18 is formed over dielectric layer 16. Each of dielectric layers 14, 16 and 18 is covered with metal layers 15, 17 and 19, respectively, which are formed together with the triple-metal process. Finally, passivation layer 22 is formed and covers all the dielectric layers and the metal layers. In summary, seal ring 30 of conventional die seal structure shown in FIG. 2 is produced by alternately depositing the dielectric layers and the metal layers. It should be noted that these dielectric layers and metal layers are formed during the common semiconductor process and do not require extra steps. In general, seal ring 30 has a width of about 20 µm, buffer area 20 between internal circuit 10 and seal ring 30 has a width of about 25 µm, and buffer space 40 between seal ring 30 and the scribe line has a width of about 3~50 µm.

The die seal structure shown in FIG. 3 is quite similar to that shown in FIG. 2, except in the following aspects. In FIG. 3, seal ring 30 includes three metal layers 32, 34 and 36, as in FIG. 2, and further includes metal plugs 31, 33 and 35, located between these metal layers. In this seal ring structure, metal layers 32, 34 and 36 and metal plugs 31, 33, 35 are also formed during the common metalization and plug-in process and do not require extra steps. Therefore, metal plugs 31, 33 and 35 are usually made of tungsten. Such a seal ring structrure is utilized in the die seal structure to enhance robustness to sawing stress, thereby preventing the internal circuit from damage.

In the development of process techniques, a technique called global planarization is commonly utilized. The most common one is CMP (chemical-mechanical polishing). When CMP is utilized in the fabrication process of semiconductors, the protection ability of the die seal may be reduced. The reason for this will be discussed in the following detailed description. When an inter-metal dielectric layer is planarized by using CMP, the dielectric layer between seal ring 30 and scribe line 50 may not be completely removed in the etching of the contact window, metal via, and passivation, and may accumulate continually on the buffer space. As shown in FIG. 2 and FIG. 3, dielectric material 24 on the buffer area 40 may have a depth of about 12000 Å in the prior art. The residual dielectric material on buffer area 40 may be a path of stress when a wafer is sawed. Thereby, the reliability of dies may be reduced.

On the other hand, the stress can reach internal circuit 10 via dielectric material 24 and substrate 4. In the prior art, the die seal structure can not provide complete protection to internal circiuts.

SUMMARY OF THE INVENTION

An object of the present invention is to provide a new structure of a die seal capable of preventing the stress from being transmitted via the dielectric material and the substrate and damaging the internal circuit in the die.

Another object of the present invention is to provide a method of fabricating the new structure of the die seal.

In order to achieve these objectives, the present invention provides a die seal having trenches. The structure of the die seal formed on a silicon substrate can be used to prevent lateral stress, which may damage the internal circuit in a die. The die seal comprises a buffer space, a die seal and a buffer area. The buffer area is adjacent to the internal circuit. The buffer space is adjacent to a scribe line. The seal ring stacked by at least one metal layer and at least one dielectric layer is located between the buffer area and the buffer space. There is no dielectric layer stacked on the buffer space having a trench on a substrate. The trench is used for enhancing the stress-protection ability of the die seal, and is formed by etching. The trench is formed by wet-etching $SiO_2$ residues on the buffer space using buffered HF, or wet-etching $Si_3N_4$ residues on the buffer space using phosphoric acid at 180° C. In addition, the portion of the substrate may be removed by wet etching using $HNO_3$ and HF. On the other hand, dry etching may also be used to remove the residual dielectric material and substrate. For example, a mixture gas of $CHF_3$, $SF_6$ and He, or the fluorocarbon-containing gas can be used in the reactive ion etching (RIE) process to etch $SiO_2$ or $Si_3N_4$. The mixture gas of $CF_4$ and Ar, or fluorocarbon-containing gas, or the mixture gas of $Cl_2$ and $BCl_3$ may be used in the reactive ion etching process to etch the silicon substrate.

BRIEF DESCRIPTION OF THE DRAWINGS

Other objects, features, and advantages of the present intention will become apparent from the following detailed description made with reference to but not-limited by the following embodiment. The description is made with reference to the accompanying drawings, in which.

DETAILED DESCRIPTION OF THE PREFERRED EMBODIMENT

Figure 1:
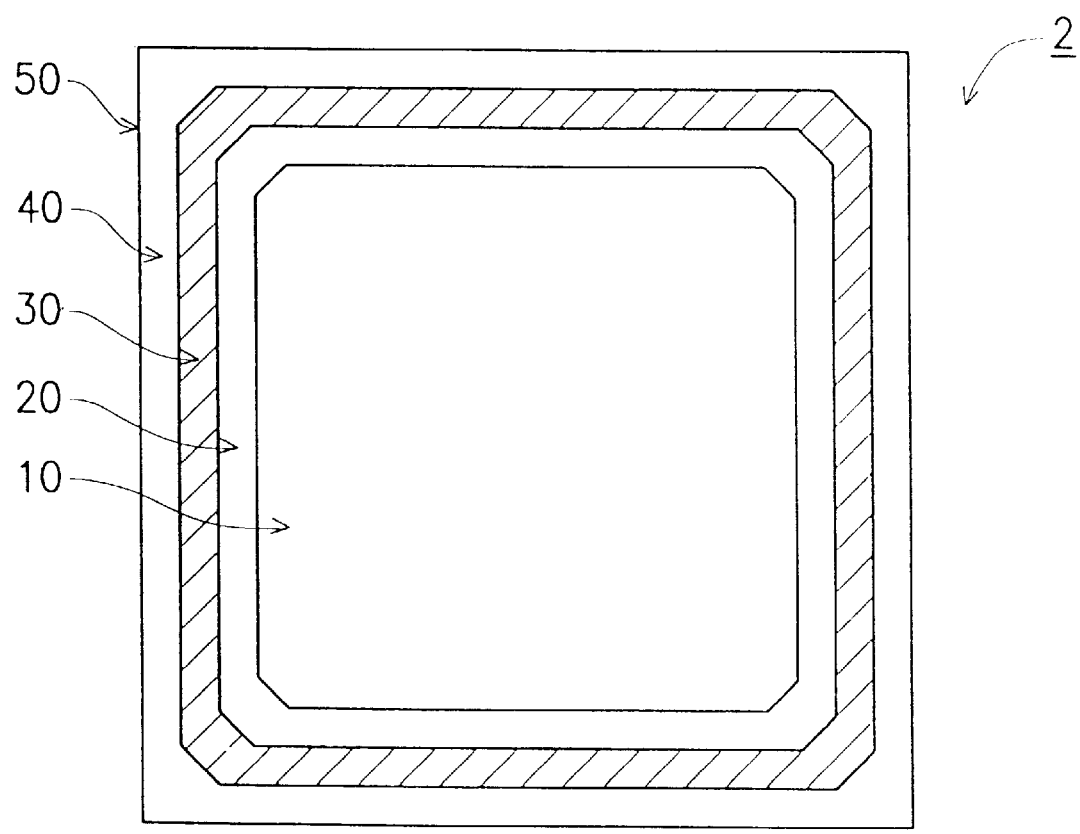
FIG. 1 is a top view of a single die after sawing a wafer.
Figure 2:
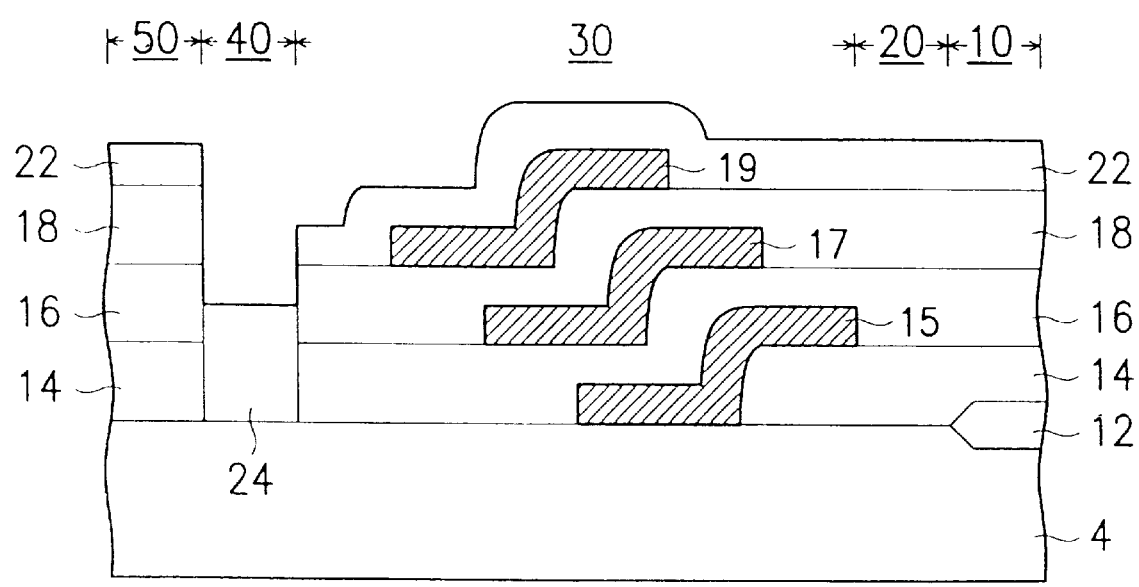
FIG. 2 (PRIOR ART) is a cross-sectional view of one conventional structure of the die seal.
Figure 3:
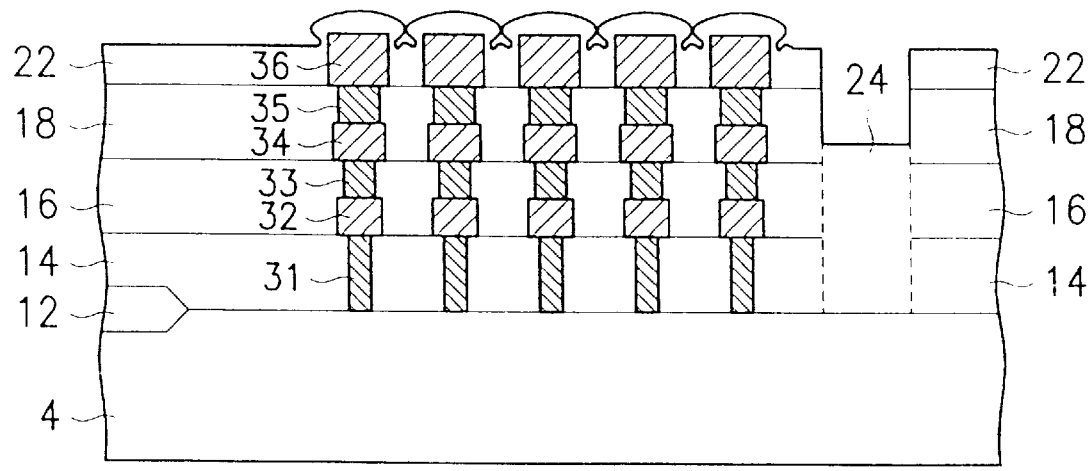
FIG. 3 (PRIOR ART) is a cross-sectional view of another conventional structure of the die seal.

The die seal described in the present invention structurally comprises a buffer area, a seal ring and a buffer space. The buffer area is adjacent to the internal circuit of the die chip enclosed by the die seal. The buffer space is adjacent to the scribe line, which is used to physically isolate the die chip with other adjacent die chips. The seal ring, which is formed and stacked by at least one metal layer and at least one dielectric layer, is located between the buffer area and the buffer space. There is no dielectric layer stacked on the buffer space. Furthermore, within the buffer space there is a trench on the semiconductor substrate, for example, formed by photolithography and etching, which is used for promoting robustness against the stress induced by cutting the wafer, especially lateral stress. In the following embodiment, a die seal having a seal ring structure similar to that shown in FIG. 2 is used. However, it is easily understood by those skilled in the art that a die seal having a seal ring structure similar to that shown in FIG. 3 can also be used in the same manner.

Figure 4:
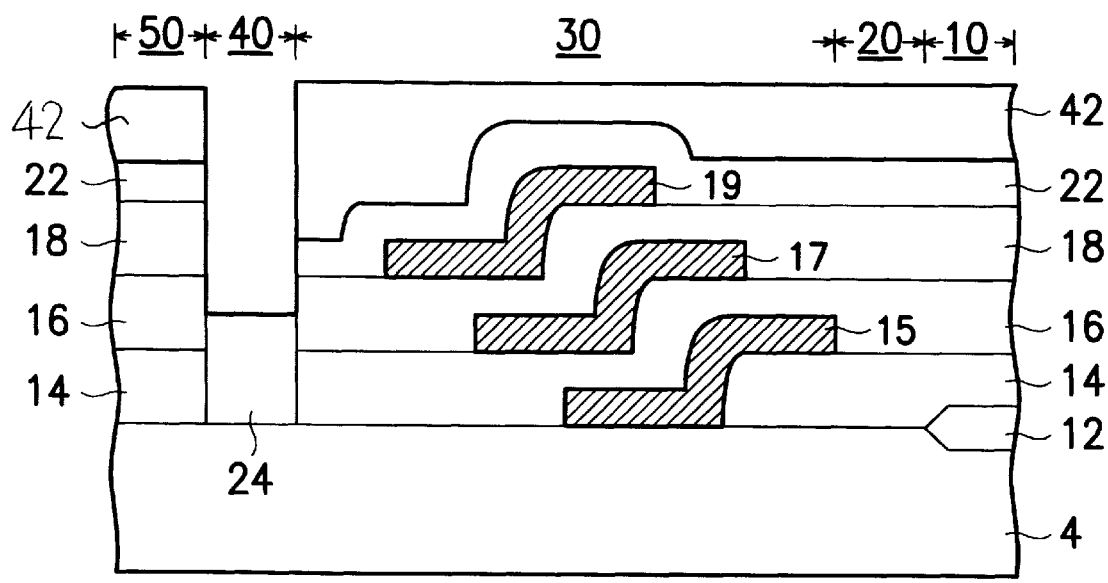
FIG. 4 and FIG. 5 are cross-sectional views showing the making of the die seal structure in accordance with the present invention.
Figure 5:
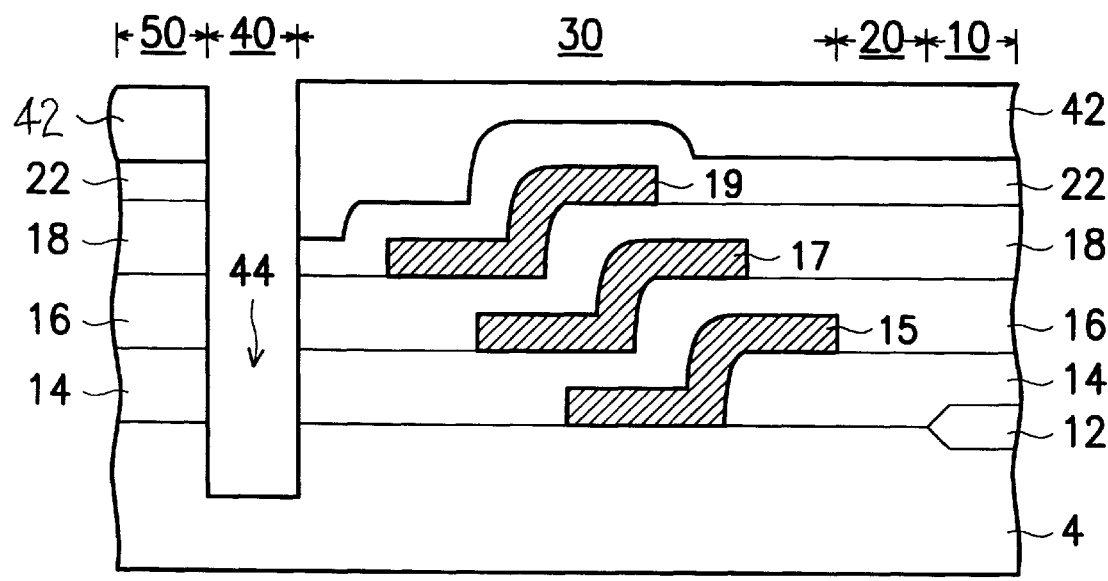

FIG. 4 and FIG. 5 are cross-sectional views of an example of the fabrication of such a die seal structure in accordance with the present invention. As shown in FIG. 4, the conventional structure of the die seal includes a buffer space having residual dielectrics 24 covered thereon, a seal ring having a structure alternately stacked with dielectric layers (14, 16, 18) and residual metal layers (15, 17, 19), and a buffer area having a stacked structure of dielectric layers (14, 16, 18 and 22). It is noted that residual dielectrics 24 in the conventional structure may serve as a routing material for the stress induced during the period of cutting wafers. Having the conventional formation in place, the manufacturing method of the present invention includes the following steps.

First, as shown in FIG. 4, photoresist is formed covering all the conventional structure described above, and then patterned by a photolithography step to form photoresist layer 42. Photoresist layer 42 is used to define the location of buffer space 40 in the die seal. Next, an etching process, such as dry etching or chemical wet etching, is applied to the structure, and removes residual dielectrics 24 and a portion of silicon substrate 4 on buffer space 40. Then trench 44, as shown in FIG. 5, is formed.

The method of removing dielectric material 24 depends on the material of dielectric material 24. The removal methods of residual dielectric material 24 on buffer space 40 comprise: (1) wet etching by buffered HF acid solution when residual dielectric material 24 is $SiO_2$; (2) wet etching by phosphoric acid at a temperature of 180° C. when residual dielectric 24 is $Si_3N_4$. In addition, silicon substrate 4 may be etched by a solution composed of nitric acid ($HNO_3$) and hydrofluoric acid (HF) diluted with acetic acid ($CH_3COOH$). In addition, dry etching may also be used to etch silicon substrate 4 and residual dielectric material 24 on buffer space 40. For example, a mixture of $CHF_3$, $SF_3$ and He and mixture gas of $CF_4$ and Ar may be used in an reactive ion etching process to etch $SiO_2$ or $Si_3N_4$, respectively. Further, fluorocarbon-containing gas may also be used to etch dielectrics, and fluorocarbon-containing gas or mixture gas of $Cl_2$ and $BCl_3$ may also be used in a reactive ion etching process to etch silicon substrate 4. After dielectric material 24 and a portion of silicon substrate 4 are removed, photoresist layer 42 is then removed and the structure of the die seal in accordance with the present invention is completed.

The structure and fabrication method of a die seal having trenches in accordance with the present invention have the following advantages. First, since the residual dielectric material may be completely removed and trenches are formed on the substrate, the structure of the die seal can prevent the stress induced during the period of cutting wafers, which may damage the internal circuits of the chip dies, thus improving the yield. Second, since dry etch and wet etch can be applied in removing a portion of the silicon substrate and the residual dielectric material on the buffer space, the fabrication method is easily implemented and very suitable for the IC process.

As persons skilled in this art may well appreciate, the above description of the preferred embodiments of the present invention is employed for the purpose of description, and not for limiting the present invention. Modifications to the outlined embodiments of the present invention may be apparent and should be considered to be within the scope of the present invention that is recited in the following claims.

What is claimed is:

1. A method of fabricating a die seal on a substrate, comprising the steps of:
   (i) providing a buffer space not less than 3 μm wide and having a dielectric residue therein directly on the substrate;
   (ii) forming a seal ring between the buffer space and a buffer area;
   (iii) applying a photolithographic process to the substrate to define a trench area;
   (iv) thereafter sequentially etching the dielectric residue in the buffer space and a portion of the substrate to form a substrate trench in the substrate within the buffer space by using one or more chemical etching or dry etching process steps.

2. The method of claim 1, wherein said one or more chemical etching or dry etching process steps use wet-etching buffered HF acid solution when the dielectric residue is $SiO_2$.

3. The method of claim 1, wherein said one or more chemical etching or dry etching process step use wet-etching phosphoric acid at 180° C. when the dielectric residue is $Si_3N_4$.

4. The method of claim 1, wherein said one or more chemical etching or dry etching process steps use a wet-etching solution of $HNO_3$ and HF diluted with $CH_3COOH$ to etch said substrate.

5. The method of claim 1, wherein etching of the dielectric residue is achieved by RIE utilizing a mixture gas of $CHF_3$ gas, $SF_6$ gas, and He gas.

6. The method of claim 1, wherein etching of the dielectric residue is achieved by RIE utilizing a fluorocarbon-containing gas.

7. The method of claim 1, wherein etching of the dielectric residue is achieved by RIE utilizing a mixture of $CF_4$ gas and Ar gas.

8. The method of claim 1, wherein etching of the portion of the substrate is achieved by RIE utilizing a fluorocarbon-containing gas.

9. The method of claim 1, wherein etching of the portion of the substrate is achieved by RIE utilizing a mixture of $Cl_2$ gas and $BCl_3$ gas.

10. A method of fabricating a die seal on a substrate, comprising the steps of:

(i) providing a buffer space having a dielectric residue therein directly on the substrate;

(ii) forming a seal ring between the buffer space and a buffer area;

(iii) patterning the substrate with a photoresist layer to define a trench area in the buffer space; and (iv) thereafter sequentially chemically or dry etching the substrate to remove dielectric residue in the trench area and to remove a portion of the substrate in the trench area to form a substrate trench.

11. The method of claim 10, wherein etching the substrate to remove dielectric residue uses wet-etching buffered HF acid solution when the dielectric residue is $SiO_2$.

12. The method of claim 10, wherein etching the substrate to remove dielectric residue uses wet-etching phosphoric acid at 180° C. when the dielectric residue is $Si_3N_4$.

13. The method of claim 10, wherein etching the substrate to remove a portion of the substrate uses a wet-etching solution of $HNO_3$ and HF diluted with $CH_3COOH$.

14. The method of claim 10, wherein etching the substrate to remove dielectric residue is achieved by RIE utilizing a mixture of $CHF_3$ gas, $SF_6$ gas, and He gas.

15. The method of claim 10, wherein etching the substrate to remove dielectric residue is achieved by RIE utilizing a fluorocarbon-containing gas.

16. The method of claim 10, wherein etching the substrate to remove dielectric residue is achieved by RIE utilizing a mixture of $CF_4$ gas and Ar gas.

17. The method of claim 10, wherein etching the substrate to remove a portion of the substrate is achieved by RIE utilizing a fluorocarbon-containing gas.

18. The method of claim 10, wherein etching the substrate to remove a portion of the substrate is achieved by RIE utilizing a mixture of $Cl_2$ gas and $BCl_3$ gas.

19. The method of claim 10, wherein the buffer space is not less than 3 $\mu$m wide.

* * * * *